(12) United States Patent
Lerner et al.

(10) Patent No.: US 11,600,603 B2
(45) Date of Patent: Mar. 7, 2023

(54) SEMICONDUCTOR DEVICE ALONG WITH MULTI-FUNCTIONAL UNITS AND METHOD FOR MANUFACTURING A SEMICONDUCTOR DEVICE

(71) Applicant: X-FAB Global Services GmbH, Erfurt (DE)

(72) Inventors: Ralf Lerner, Erfurt (DE); Nis Hauke Hansen, Erfurt (DE)

(73) Assignee: X-FAB GLOBAL SERVICES GMBH, Erfurt (DE)

( * ) Notice: Subject to any disclaimer, the term of this patent is extended or adjusted under 35 U.S.C. 154(b) by 249 days.

(21) Appl. No.: 17/113,563

(22) Filed: Dec. 7, 2020

(65) Prior Publication Data

US 2021/0175215 A1 Jun. 10, 2021

(30) Foreign Application Priority Data

Dec. 10, 2019 (DE) .................... 10 2019 133 777.1
Mar. 17, 2020 (DE) .................... 10 2020 107 288.0

(51) Int. Cl.
| | |
|---|---|
| *H01L 25/07* | (2006.01) |
| *H01L 29/778* | (2006.01) |
| *H01L 29/20* | (2006.01) |
| *H01L 25/00* | (2006.01) |
| *H01L 23/00* | (2006.01) |

(52) U.S. Cl.
CPC ............ *H01L 25/072* (2013.01); *H01L 24/19* (2013.01); *H01L 24/24* (2013.01); *H01L 24/25* (2013.01); *H01L 25/50* (2013.01); *H01L 29/2003* (2013.01); *H01L 29/778* (2013.01); *H01L 2224/24137* (2013.01); *H01L 2224/25175* (2013.01)

(58) Field of Classification Search
CPC ....... H01L 25/072; H01L 24/19; H01L 24/24; H01L 24/25; H01L 25/50; H01L 29/2003; H01L 29/778; H01L 2224/24137; H01L 2224/25175
USPC .......................................................... 257/368
See application file for complete search history.

(56) References Cited

U.S. PATENT DOCUMENTS

| | | |
|---|---|---|
| 5,300,788 A | 4/1994 | Fan et al. |
| 5,874,764 A | 2/1999 | Hsieh et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 8,664,699 B2 | 3/2014 | Nuzzo et al. |
| 9,698,308 B2 | 7/2017 | Bower et al. |
| 2006/0081985 A1* | 4/2006 | Beach ............... H01L 29/41758 257/E29.252 |

(Continued)

FOREIGN PATENT DOCUMENTS

| | | |
|---|---|---|
| DE | 112011101135 T5 | 2/2021 |
| EP | 2339614 A1 | 6/2011 |

*Primary Examiner* — Didarul A Mazumder
(74) *Attorney, Agent, or Firm* — Duane Morris LLP

(57) ABSTRACT

A semiconductor component includes at least two functional units which are identical to one another and are wired to one another, the identical functional units each include at least one gate finger, at least one source finger and at least one drain finger; the wiring comprising conductor tracks. A first track connects the gate fingers respectively, a second track connects the source fingers respectively, and a third track connects the drain fingers of the at least two same functional units, respectively.

33 Claims, 4 Drawing Sheets

(56) References Cited

U.S. PATENT DOCUMENTS

| | | | |
|---|---|---|---|
| 2009/0294803 A1 | 12/2009 | Nuzzo et al. | |
| 2013/0069275 A1 | 3/2013 | Menard et al. | |
| 2014/0239349 A1* | 8/2014 | Briere | H01L 23/4824 257/194 |
| 2015/0129965 A1* | 5/2015 | Roy | H01L 23/50 257/347 |
| 2017/0271329 A1* | 9/2017 | Farrell | H01L 29/404 |
| 2017/0271497 A1* | 9/2017 | Fayed | H01L 29/0696 |
| 2020/0027850 A1* | 1/2020 | Trang | H01L 23/66 |
| 2020/0343352 A1* | 10/2020 | Trang | H01L 29/41725 |

* cited by examiner

SEMICONDUCTOR DEVICE ALONG WITH MULTI-FUNCTIONAL UNITS AND METHOD FOR MANUFACTURING A SEMICONDUCTOR DEVICE

FIELD

The invention relates to a semiconductor device and a method for manufacturing a (MEMS) semiconductor device. For the manufacture of the semiconductor device, (only) functional units that are uniform or identical to each other can be used. A desired number of functional units can be transferred to a semiconductor wafer by a transfer printing step and then wired to each other to form a finished semiconductor device. Thus, the properties (conductivity, resistance, power etc.) of the semiconductor device are determined by the number of the transferred identical functional units and the wiring thereof.

BACKGROUND

In micro-transfer printing, micro-scale components, especially semiconductor devices, such as e.g. transistors, are applied to a non-native substrate by a transfer stamp. Micro-transfer printing is a highly scalable method in which a plurality of devices can be transferred together in one process step.

Components that are to be transferred from a donor substrate to the non-native substrate are exposed in previous process steps. Typically, the components are exposed by masking and subsequently etching the micromechanical or microelectronic components free from a semiconductor wafer (e.g. a silicon wafer). In the free-etching process, etching is initially performed on the sides, wherein connection elements (so-called tethers) are excluded from the etching process due to the masking. In a next etching step, etching is performed underneath the components, wherein the components are mechanically held by the connection elements. In micro-transfer printing, a surface area of the exposed components is brought into conformal contact with the surface of the transfer stamp, and the components can be released from the semiconductor wafer (and the connection elements can be broken, respectively) due to adhesion between component and stamp, and the components can then be transferred and fixed to another semiconductor wafer.

Various micro-transfer printing methods are known from the prior art. In particular, methods are known in which the components are transferred from a first semiconductor wafer to a non-native substrate, in most cases a second semiconductor wafer, by an elastomeric stamp.

US 2009/0294803 A1, DE 11 2011 101 135 T5 and U.S. Pat. No. 8,664,699 B2 disclose methods of semiconductor devices in which an elastomeric stamp is used for transfer printing. It is shown therein that by using this method it is, for example, possible to transfer a plurality of devices, e.g. gallium nitride transistors (GaN transistors), fabricated on a first carrier substrate from a first semiconductor wafer to a second semiconductor wafer per stamping operation, wherein the first and the second semiconductor wafers can differ from each other in one or more properties. Corresponding process steps are performed in order to fabricate the desired devices or components on the semiconductor wafers as the carrier substrates.

The processing on the basis of the entire carrier substrate enables a cost-effective manufacture since the processing is performed for a plurality of composite devices, e.g. circuits, in the same process step, as is also known from the manufacture of standard integrated circuits. For example, transferred gallium nitride high-electron mobility transistors (GaN HEMT) can be covered by a via-insulating layer, structured and wired to a metal layer.

U.S. Pat. No. 7,932,123 B2 discloses methods in which a plurality of release layers are used in order to make functional structures printable. The release layers can be sacrificial layers inserted between functional layers. By removing individual sacrificial layers, the functional layers (components) can be exposed and are thus printable.

U.S. Pat. No. 7,943,491 B2 and US 2013/0069275 A1 describe a kinetically controlled method in which the adhesion forces between the transfer stamp and a device to be transferred can be changed by the delamination or separation rate [mm/s] in order to temporarily attach the devices to be transferred to the stamp and to finally fix them to the receiver, respectively. In the case of a fast separation, high adhesion forces are created, the devices are temporarily attached to the stamp and released from the donor. The devices can again be released from the stamp by low separation rates and thus low adhesion forces.

U.S. Pat. No. 7,799,699 B2 describes the free etching of AlGaN/GaN heterostructure components on (111) silicon. By suitable masking and vertical ICP (inductive coupled plasma) etching, exposed, i.e. unmasked trenches are etched next to the device. In the horizontal direction, the devices are etched beneath the component by TMAH etching of the silicon substrate.

Mechanical fixing in the horizontal direction is accomplished by suitable interruptions of the trenches, i.e. material bridges that are not etched away.

U.S. Pat. No. 5,300,788 A describes a method in which a strip of III-V semiconductor material comprising a plurality of LEDs and an isolated metallization is applied to a silicon wafer. The III-V strip is applied in a buried manner and the previously isolated metallization provides for electrical contact with elevated contact areas on the Si wafer.

EP 2 339 614 A1 shows a transfer method with a first carrier and first devices, such as MEMS or CMOS, fabricated thereon in a grid pattern, and a second carrier, such as a PCB or device carrier substrate, comprising second devices, wherein a further carrier releases the devices from the first carrier and applies them to the second carrier.

U.S. Pat. No. 9,698,308 B2 shows a number of LEDs that are printed onto the second semiconductor wafer and are wired to a microcontroller. Each LED is defined by the layout of the LED on the first semiconductor wafer and remains unchanged.

The properties of, for example, a transistor are adjusted via its surface area and its channel width, respectively. Thus, the electrical resistance, conductivity and power of the transistor (as an example semiconductor device) can be determined. In prior art methods, manufacturing processes are considered in which only a specific semiconductor device is fabricated (many times). When it is desired to fabricate a semiconductor device having different properties in a manufacturing process, the semiconductor device has to be designed accordingly and realized in a different manufacturing process.

U.S. Pat. No. 5,874,764 A (Chang-Ming Hsieh et al., IBM) illustrates a semiconductor device including two functional units (131, 132, therein) that are identical to each other and wired to each other. The identical functional units (131, 132, therein) each comprise:
 a gate finger ($205_{1-3}$, therein),
 a source finger ($203_{1-3}$, therein), and
 a drain finger ($204_{1-3}$).

SUMMARY

It is an object of the claimed semiconductor device that a semiconductor device can be manufactured in are more time and cost-efficient manner and that the flexibility of a manufacturing process for fabricating the semiconductor device can be increased.

As a solution, a semiconductor device comprises at least two functional units that are identical to each other and wired to each other. Each of the at least two identical functional units comprises at least one gate finger, at least one source finger and at least one drain finger. The wiring comprises conductor tracks. A first conductor track interconnects each of the gate fingers, a second conductor track interconnects each of the source fingers and a third conductor track interconnects each of the drain fingers of the at least two identical functional units.

One functional unit of the at least two identical functional units can comprise active regions. The active regions can be of an elongate, e.g. rectangular shape (2D), or a cuboid shape (3D). Here, the active regions are the regions that can serve the purpose of controlling the functional units. In a field effect transistor (FET), active regions are, for example, drain, source or gate.

The active regions may be referred to as drain, source and gate fingers.

One functional unit of the at least two identical functional units of the semiconductor device can have a multi-finger transistor layout.

It is characteristic for a multi-finger transistor layout that the active regions of a transistor are divided into a plurality of elongate regions (fingers), in particular, transistors having a great width (W) are divided (folded) into a plurality of regions in order to avoid high resistance in gate, drain and source in an FET, for example.

Each functional unit can comprise at least two gate fingers, at least two source fingers and at least two drain fingers, in particular, each functional unit can comprise four gate fingers, three source fingers and two drain fingers.

The source and drain fingers can be arranged in an alternating manner. One gate finger each can be arranged between a source finger and a drain finger.

Each gate finger can comprise a gate contact area, each source finger can comprise a source contact area, and each drain finger can comprise a drain contact area.

Each gate finger can comprise at least two gate contact areas, each source finger can comprise at least two source contact areas and each drain finger can comprise at least two drain contact areas.

The first, second and third conductor tracks can interconnect, especially electrically contact, each of the gate contact areas, source contact areas and drain contact areas.

The gate contact areas, source contact areas and drain contact areas of the two identical functional units can be arranged in such a manner that an imaginary straight line can be drawn in one direction in each case, which line interconnects all contacts of a respective terminal type (gate, source, drain), without any contact of another terminal type being intersected by the imaginary straight line. The at least two identical functional units can especially be arranged side by side in a row for this purpose.

The first conductor track, the second conductor track and the third conductor track can be rectilinear, especially parallel to each other.

The semiconductor device can comprise a plurality of functional units that are identical to each other, especially at least five identical functional units.

The at least two identical functional units can be arranged in a grid, especially arranged directly adjacent to each other. In this context, directly adjacent means that a distance between the functional units can be less than a height or width of a functional unit.

The functional units can be arranged lying in a plane. The grid can lie congruently in the plane that is spanned by a surface of the semiconductor device. The coordinates within the plane can be clearly defined or expressed by an x-y coordinate system lying in the plane.

The grid can be a network of lines for separating the surface of the semiconductor device into a plurality of segments so that outlines of the functional units are defined on the semiconductor wafer.

The first conductor track can interconnect the gate contact areas of all gate fingers of the at least two identical functional units. Analogously, the second conductor track can interconnect the source contact areas of all source fingers and the third conductor track can interconnect the drain contact areas of all drain fingers of the at least two identical functional units.

Alternatively, contact areas cannot be encompassed by the first, second and/or third conductor tracks so that contact areas remain unconnected.

At least one gate contact area cannot be encompassed by the first conductor track, at least one source contact area cannot be encompassed by the second conductor track and at least one drain contact area cannot be encompassed by the third conductor path, especially not be electrically contacted thereto.

For example, each functional unit can comprise at least six gate fingers, four source fingers and three drain fingers, of which in each case a maximum of two can be interconnected by the first, second or third conductor track via the corresponding contact areas within the functional unit.

A gate finger can be short-circuited to a source finger, especially within a functional unit.

The identical functional units can be transistors. Preferably, the identical functional units can be gallium nitride transistors with high electron mobility (GaN HEMT).

The functional units wired to each other can form a semiconductor device.

The semiconductor device itself can be a transistor.

The semiconductor device can be a gallium nitride transistor with high electron mobility (GaN HEMT).

Another example of the disclosure is a method for manufacturing a semiconductor device. It comprises providing a first semiconductor wafer having a plurality of functional units that are identical to each other, providing a second semiconductor wafer, transferring at least two identical functional units from the first semiconductor wafer to the second semiconductor wafer in one transfer step, and wiring the at least two identical functional units transferred to the second semiconductor wafer to the semiconductor device.

The identical functional units can be semiconductor devices.

The identical functional units can be transistors.

The identical functional units can be unwired transistors (transistor precursors).

The identical functional units can be micromechanical devices.

The functional units can be fabricated in a different process and provided to the method so that the identical functional units can be released from the first semiconductor wafer in a (micro) transfer step and printed onto the second semiconductor wafer.

The transfer step can comprise a transfer printing step (micro-transfer printing step The at least two identical functional units can be transferred from the first semiconductor wafer by a transfer printing stamp, especially by an elastomeric stamp.

The identical (small) functional units on the first semiconductor wafer can be arranged in a first grid.

The arrangement of the identical devices can enable or facilitate the (micro) transfer printing step of a plurality (as an array) of identical functional units to the second semiconductor wafer. The transfer printing stamp can be scaled accordingly for this method step.

The method can also comprise a plurality of transfer steps.

In the method, at least five identical functional units can be transferred from the first semiconductor wafer to the second semiconductor wafer.

The second semiconductor wafer can be provided to the method having (semiconductor) devices already arranged thereon and electrically connected to each other.

The (semiconductor) devices electrically connected to each other on the second semiconductor wafer can form an electronic circuit or an integrated circuit (IC).

The (semiconductor) devices electrically connected to each other can form a still incomplete or not yet functional integrated circuit. In this context, incomplete integrated circuit means that the (semiconductor) devices electrically connected to each other constitute a precursor to an integrated circuit (precursor circuit), By adding and wiring further (semiconductor) devices, e.g. transistors, the precursor circuit can be made a functional integrated circuit.

Functional units of the first semiconductor wafer can be transferred to the second semiconductor wafer. The functional units can be wired to each other and electrically connected and wired, respectively, to at least one device of the devices electrically connected to each other. By wiring the functional units to each other and wiring the functional units to at least one device of the devices electrically connected to each other, the precursor circuit can be completed to form an integrated circuit, or the precursor circuit can be made a (functional) integrated circuit.

The (semiconductor) devices electrically connected to each other can have been transferred to the second semiconductor wafer and electrically connected to each other in another method process, The (semiconductor) devices electrically connected to each other on the second semiconductor wafer can comprise or be diodes, resistors, capacitors, coils, voltage sources, inductors, resonators, thyristors and/or relays.

The functional units can be arranged in a second grid on the second semiconductor wafer, especially be laterally spaced from each other. Preferably, the transferred functional units are arranged side by side in a row.

The distance between the printed functional units on the second semiconductor wafer is at least less than a height or a width of the functional units.

The identical functional units on the first semiconductor wafer can be identical transistors.

The identical functional units on the first semiconductor wafer can be unwired transistors. Here, unwired means that the active regions of the same terminal type are not interconnected via conductor tracks within a transistor (transistor precursor) and that the active regions of the same terminal type are not interconnected between the transistors.

A functional unit (representative of all of them) can comprise a gate finger, a source finger and a drain finger.

The functional unit can comprise a plurality of gate, source and/or drain fingers.

The functional unit can comprise at least two gate fingers, at least two source fingers and/or at least two drain fingers.

The number of drain fingers plus the number of source fingers can be greater by one than the number of the gate fingers.

Each gate finger can comprise a gate contact area, each source finger can comprise a source contact area and each drain finger can comprise a drain contact area.

The contacts to the active regions of the functional units can be made of a metallization.

The metallization can comprise a metallization layer, of which the conductor tracks can be made. The metallization layer can be applied to the second semiconductor wafer after the transfer of the identical functional units.

Each gate finger can comprise at least two gate contact areas, each source finger can comprise at least two source contact areas and/or each drain finger can comprise at least two drain contact areas.

All contact areas can be electrically contactable.

The gate contact areas, source contact areas and drain contact areas of the printed functional units can be arranged in such a manner that an imaginary straight line can be drawn in one direction in a plane spanned by the surface of the second semiconductor wafer in each case, which line interconnects all contacts of a respective terminal type (gate, source, drain), without any contact of another terminal type being intersected by the imaginary straight line.

The wiring can comprise a plurality of conductor tracks: a gate conductor track, a source conductor track and drain conductor track.

The conductor tracks can be rectilinear.

The gate conductor track can interconnect all gate contact areas, the source conductor track can interconnect all source contact areas and the drain conductor track can interconnect all drain contact areas of the printed identical functional units on the second semiconductor wafer.

However, not all contacts can be encompassed by the three conductor tracks according to the terminal type, e.g. the gate conductor track may not interconnect all gate contact areas of all gate fingers. The same applies to the source conductor track (source contact areas) and the drain conductor track (drain contact areas). Thus gate, source and/or drain contacts can remain unconnected. Preferably, per terminal type, a maximum of two fingers can be interconnected within a functional unit comprising at least three or more fingers per terminal type.

For example, a gate finger of the functional unit can be short-circuited to a source finger.

By not connecting one or more source finger(s) or one or more drain finger(s), or by short-circuiting fingers to each other, the semiconductor device cannot be locally activated. Due to the lack of power dissipation, the heating would be reduced accordingly. Thus, a thermal maximum in the center of the printed functional units wired to each other (as a semiconductor device) can be reduced.

The semiconductor device consisting or made of at least two identical functional units wired to each other can be a transistor, especially a GaN HEMT.

In another embodiment, the semiconductor device comprises semiconductor dies on a carrier that are physically separate from each other and comprise at least two functional units that are identical to each other and wired to each other. The wiring comprises conductor tracks. Each of the at least two functional units comprises at least one gate finger, at least one source finger and at least one drain finger. A first one of the conductor tracks interconnects each of the gate fingers, a second one of the conductor tracks interconnects each of the source fingers and a third one of the conductor tracks interconnects each of the drain fingers of the at least two identical functional units. The connection can be electrically conductive. The semiconductor dies can comprise gate, source and drain contact fingers on their upper surfaces.

INTRODUCTION TO THE FIGURES

The embodiments of the invention are illustrated by examples, however, not in a way that transfers or incorporates limitations from the Figures into the patent claims. Same reference numerals in the Figures denote same elements.

DETAILED DESCRIPTION OF THE FIGURES

Figure 1:
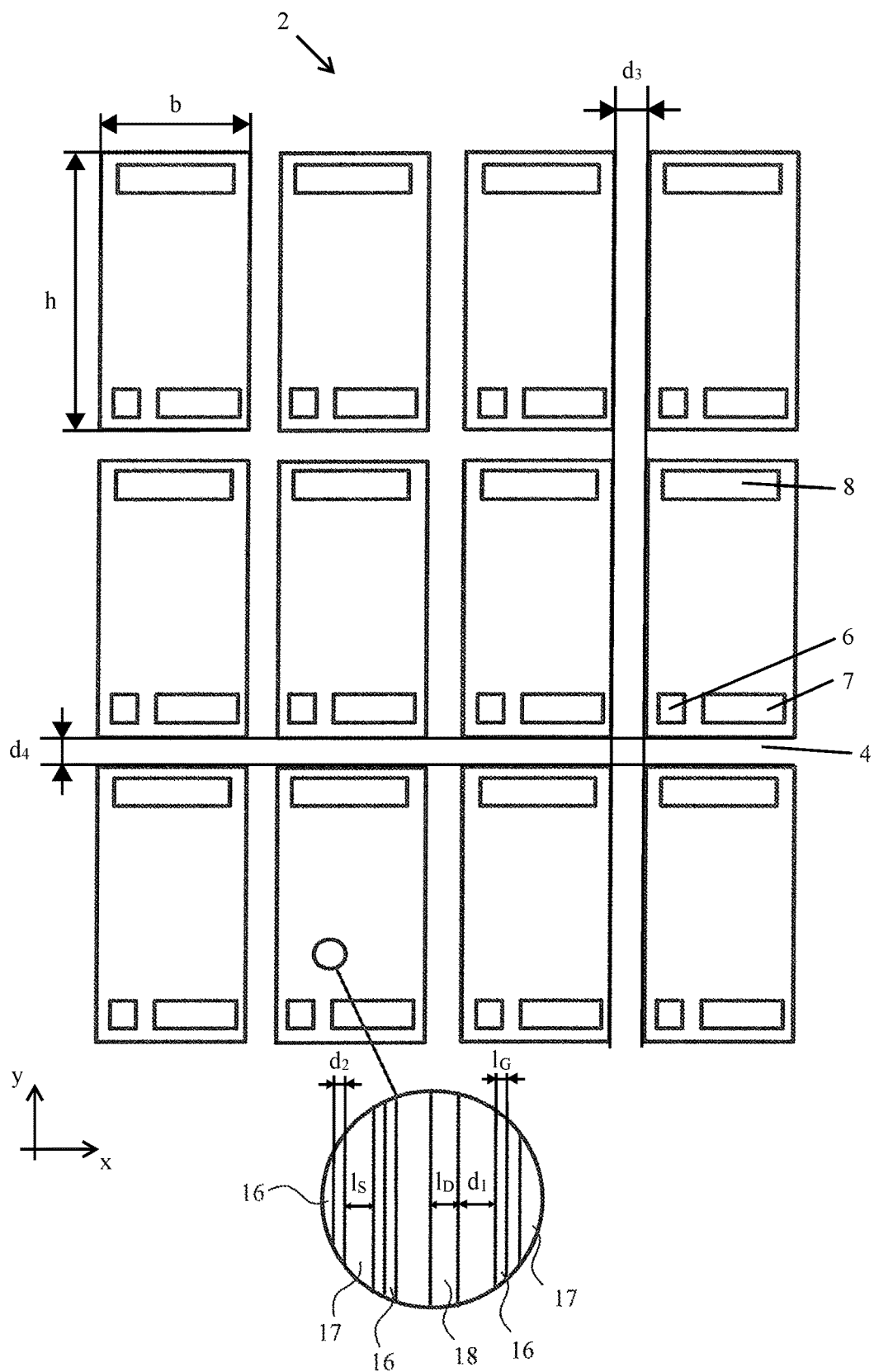
FIG. 1 shows first functional units 2 on a first semiconductor wafer.

FIG. 1 shows functional units 2 that are identical to each other and arranged on a first semiconductor wafer in an array (grid) consisting of three times four functional units 2.

The functional units 2 on the first semiconductor wafer are arranged lying in a plane.

The array or grid in which the functional units 2 are arranged is congruent with the plane spanned by a surface of the functional units 2. The coordinates can be clearly defined by an x-y coordinate system. The functional units 2 are of a rectangular basic shape.

A detailed view of a functional unit 2 is shown in FIG. 1, from which it is apparent that the functional unit 2 comprises three gate fingers 16, two source finger 17 and one drain finger 18 that have an elongate (finger-like) extension. The functional unit 2 comprises further gate fingers 16, further source fingers 17 and further drain fingers 18 (not shown).

Each functional unit 2 can be transistor, especially a GaN HEMT.

Each functional unit 2 can preferably comprise at least two gate fingers 16, at least two source fingers 17 and/or at least two drain fingers 18.

The gate fingers 16, source fingers 17 and drain fingers 18 can be of a rectangular basic shape, wherein the width-to-height ratio is preferably less than 1:4 (width to height or height to width), particularly preferably less than 1:8.

The distances between the individual gate, source and drain fingers 16, 17, 18 differ in size. The distance $d_1$ between the drain finger 18 and the gate finger 16 arranged adjacent thereto is greater than the distance $d_2$ between the gate finger 16 and the source finger 17 arranged adjacent thereto ($d_1 > d_2$).

The distances $d_1$ from the drain finger 18 to the gate fingers are each equal in size. The same applies to the distances $d_2$ between the gate fingers 16 and the source fingers 17.

The functional units 2 are separated from each other by a trench 4.

The trench 4 can be required for a previous manufacturing process of the functional units 2, especially for free etching thereof.

A distance $d_3$ is the distance between the functional units 2 as seen in the x direction (width of the trench 4 in the x direction).

A distance $d_4$ is the distance between the functional units 2 as seen in the y direction (width of the trench 4 in the y direction).

The distances $d_3$, $d_4$ can differ in size.

Each functional unit 2 comprises one gate contact area 6, one source contact area 7 and one drain contact surface 8.

The gate contacts 6 can be of a square basic shape. The source contact areas 7 and the drain contact areas 8 can be of a rectangular basic shape.

According to the terminal type (gate, source, drain), the gate fingers 16, source fingers 17 and drain fingers 18 can be wired to each other within one functional unit 2.

The gate contact area 6, source contact area 7 and drain contact area 8 of the functional unit 2 can especially be electrically contactable.

A plurality of functional units 2 can be arranged on the semiconductor wafer, preferably more than one hundred identical functional units 2.

Figure 2:
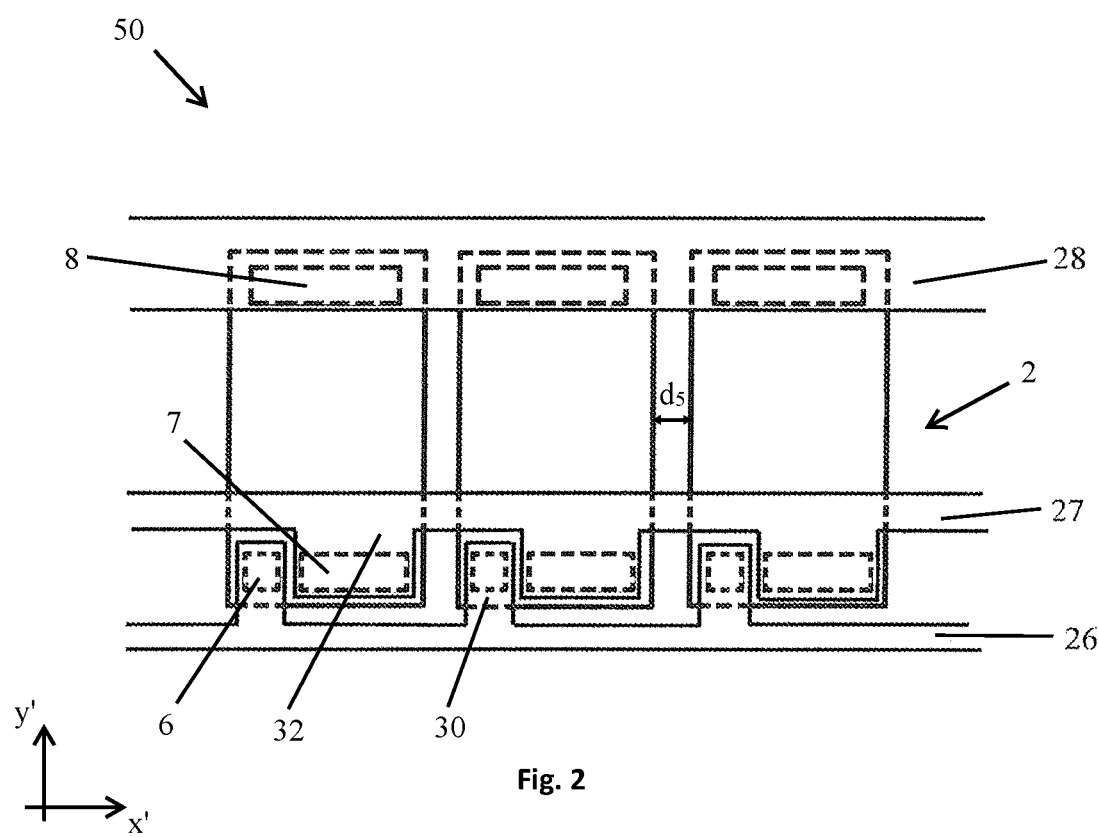
FIG. 2 shows printed functional units that are wired to each other on a second semiconductor wafer, as a semiconductor device 50.

FIG. 2 shows a semiconductor device 50 on a second semiconductor wafer. The semiconductor device 50 comprises three wired functional units 2 that are wired or connected to each other via conductor tracks.

The semiconductor device 50 can be a transistor that is formed of a plurality of (small) functional units 2 wired to each other which, in turn, can be transistors.

The three functional units 2 are arranged side by side in a row on the second semiconductor wafer. The distance $d_5$ between the functional units 2 is equal in each case.

The distance $d_5$ can be equal to the distance between the functional units 2 on the first semiconductor wafer (distance $d_3$).

The wiring comprises three conductor tracks: a gate conductor track 26, a source conductor track 27 and a drain conductor track 28.

The gate conductor track 26 interconnects all gate contact areas 6 of the three functional units 2, the source conductor track 27 interconnects all source contact areas 7 and the drain conductor track 28 interconnects all drain contact areas 8.

The second semiconductor wafer can comprise an integrated circuit, a processor and/or a die, onto which the functional units 2 can be (additionally) printed.

The ends of the gate conductor track 26, source conductor track 27 and/or drain conductor track can be guided, for example, to an edge of the die in order to establish a connection from the die to the package or to be connected to other (semiconductor) devices.

The conductor tracks can comprise metal, especially be made of metal.

The conductor tracks can be made of a metallization plane or a plurality of metallization planes.

The metallization plane can be applied to the second semiconductor wafer after the transfer of the functional units 2. After applying the metallization plane, the conductor tracks can be made of the metallization plane in further processing steps.

The wiring can comprise applying and processing a plurality of (at least two) metallization planes.

The conductor tracks can comprise aluminum or copper.

The gate contact areas 6 and source contact areas 7 are at the same height (as seen in the x' direction).

The drain contact areas 8 are not at the same height as the other contact areas 6, 7.

The gate conductor track 26 has a rectilinear path that is arranged beneath the gate contact areas 6 (as seen in the y' direction), from which (rectangular) protruding regions 30 extend towards the gate contact areas 6 and contact the same.

The source conductor track 27 has a rectilinear path that is arranged above the source contact areas 7 (as seen in the y' direction), from which (rectangular) protruding regions 32 extend towards the source contact areas 7 and contact the source contact areas 7.

The drain conductor track 28 can be of an exclusively rectilinear shape and is at the same height as the drain contact areas 8 or rather overlaps and contacts the same.

Figure 3:
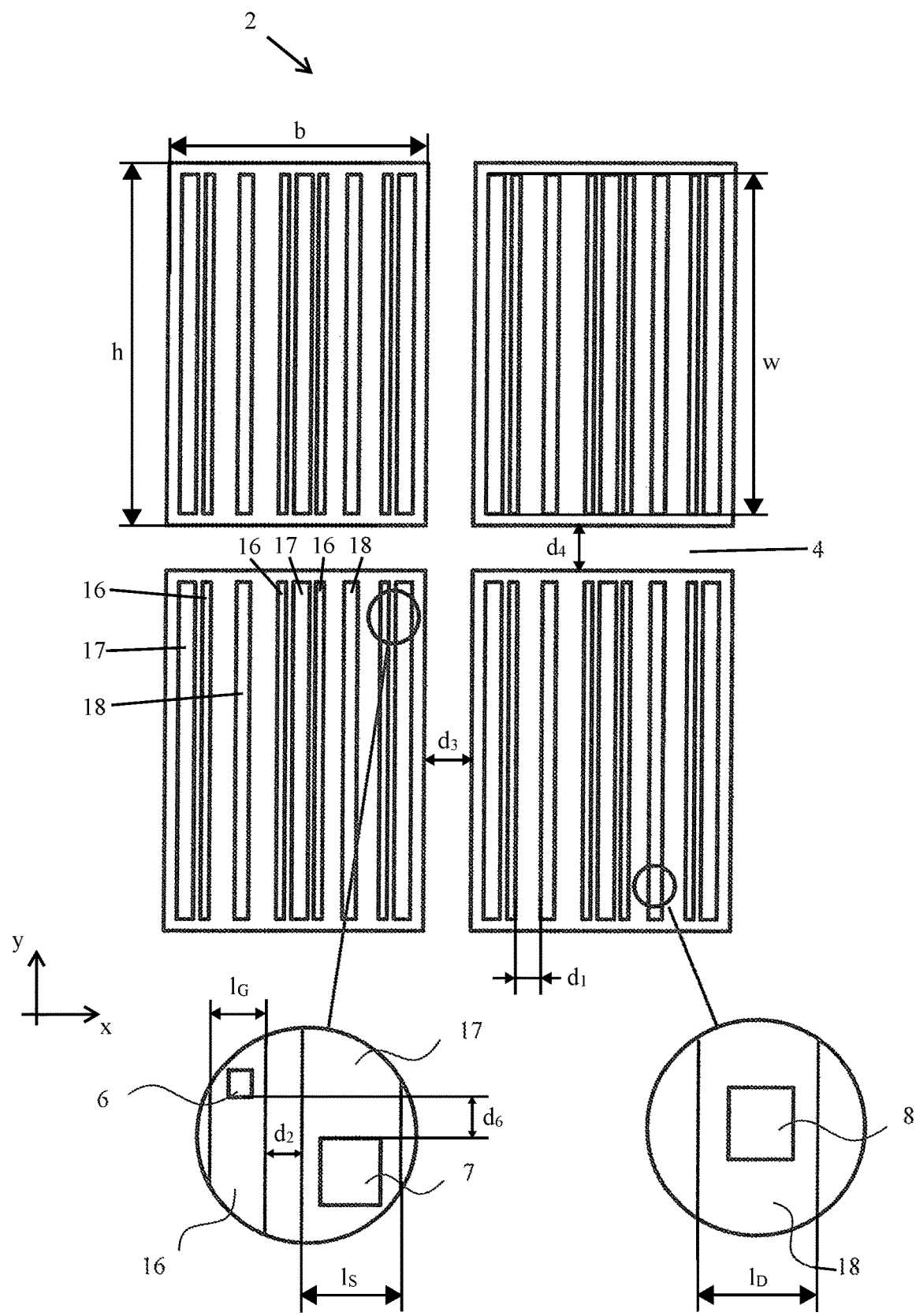
FIG. 3 shows first (unwired) functional units 2 on a first semiconductor wafer.

FIG. 3 shows functional units 2 on a first semiconductor wafer that are identical to each other.

The functional units can be unwired transistors (transistor precursors).

The four functional units 2 are arranged in an array (grid).

The functional units 2 on the first semiconductor wafer are arranged lying in a plane. The array/grid, in which the functional units 2 are arranged, is congruent with the plane spanned by a surface of the functional units 2.

The coordinates can be clearly defined by an x-y coordinate system (or x'-y' coordinate system on a second semiconductor wafer).

The functional units 2 can be of a rectangular basic shape.

The functional units 2 can be separated from each other by a trench 4.

A distance $d_3$ between the functional units 2 (as seen in the x direction) is equal in each case.

Analogously, a distance $d_4$ between the functional units 2 (as seen in the y direction) is equal as well.

The distance $d_3$ can be greater than the distance $d_4$.

The distances $d_3$, $d_4$ between the functional units (as seen in the x direction and the y direction, respectively) can be equal in size.

A functional unit 2 comprises a plurality of active regions formed as elongate (finger-like regions.

The functional unit 2 comprises a plurality of gate fingers 16, source fingers 17 and drain fingers 18. In this example, four gate fingers 16, three source fingers 17 and two drain fingers 18 are shown.

The gate, source and drain fingers 16, 17, 18 are oriented vertically (along the y direction) and a width w thereof is less than a height h of the functional unit 2 (w<h), in particular, the width w can be 95% of the height h of the functional unit (or the width w is 5% less than the height h).

The lengths $l_G$, $l_S$, $l_D$ of the gate fingers 16, the source fingers 17 and the drain fingers 18 differ (from each other).

The lengths $l_G$, $l_S$, $l_D$ can be equal to each other.

The distance $d_1$ is the distance between a drain finger 18 and a gate finger 16.

The distance $d_2$ is the distance between a gate finger 16 and a source finger 17.

The distance $d_1$ is greater than the distance $d_2$.

The distance $d_1$ can be equal to $d_2$.

The distance $d_1$ between the drain finger 18 and the adjacent gate finger(s) 16 is equal in each case. The distance $d_2$ between the gate fingers 16 and the source fingers 17 arranged adjacent thereto is equal as well. The distance $d_1$ can differ from the distance $d_2$.

A first detailed view (on the left) in FIG. 3 shows a gate finger 16 and a source finger 17 of a functional unit 2 in an enlarged view.

The gate finger 16 comprises a gate contact area 6 and the source finger 17 comprises a source contact area 7. The contact areas can be of a square basic shape.

The contact areas 6, 7, 8 can be of a different basic shape.

The gate contact area 6 and the source contact area 7 are not at the same height as seen in a y direction or are spaced from each other (distance $d_6$) in the y direction.

Each gate finger 16 and each source finger 17 can comprise at least one contact area 6, 7.

The gate contact areas 6 can all be at a same height (same y coordinates). Analogously, the source contact areas 7 can all be at a same height or can be interconnected by a straight line in an x direction.

A second detailed view (on the right) shows an enlarged section of a drain finger 18 of the functional unit 2. The drain finger 18 comprises a drain contact area 8.

The drain contact area 8 can be of a square basic shape and can be arranged centrally (in the x direction) on the drain finger. Each of the gate contact area 6 and the source contact area 7 can also be arranged centrally on the drain finger 16 and source finger 17, respectively, as seen in the x direction.

Each drain finger 18 can comprise at least one drain contact area 8.

When each of the drain fingers 18 has a drain contact area 8, the drain contact areas 8 can all be arranged at a same height (same y coordinates) so that the drain contact areas 8 can be interconnected by a straight line in an x direction. The same applies to each of the gate fingers 16 and source fingers 17 that comprise a contact area.

The contact areas 6, 7, 8 are arranged such that an imaginary straight line can be laid (drawn) in the x direction in each case, i.e. laid such that all contacts can be interconnected according to the terminal type (gate, drain, source), without the imaginary straight lines intersecting any contact of another terminal type, i.e. they are parallel to each other.

A gate finger 16 can comprise at least two gate contact areas 6. The at least two gate contact areas 6 can be spaced from each other, especially be arranged at different heights in a y direction (having the same x coordinates).

The at least two gate contacts 6 can be spaced from each other as well as from the contacts of the other terminal types 7, 8, in particular, they can be arranged in such a manner that imaginary straight lines, each intersecting only contacts of one terminal type, can be drawn in x directions of the functional unit 2 (having different y coordinates).

The same principle can be applied to source fingers 17 and drain fingers 18 within the functional unit 2, each having at least two contact areas 7, 8.

The gate contact areas 6, source contact areas 7 and drain contact areas 8 are not wired to each other within a functional unit 2 on the first semiconductor wafer.

Figure 4:
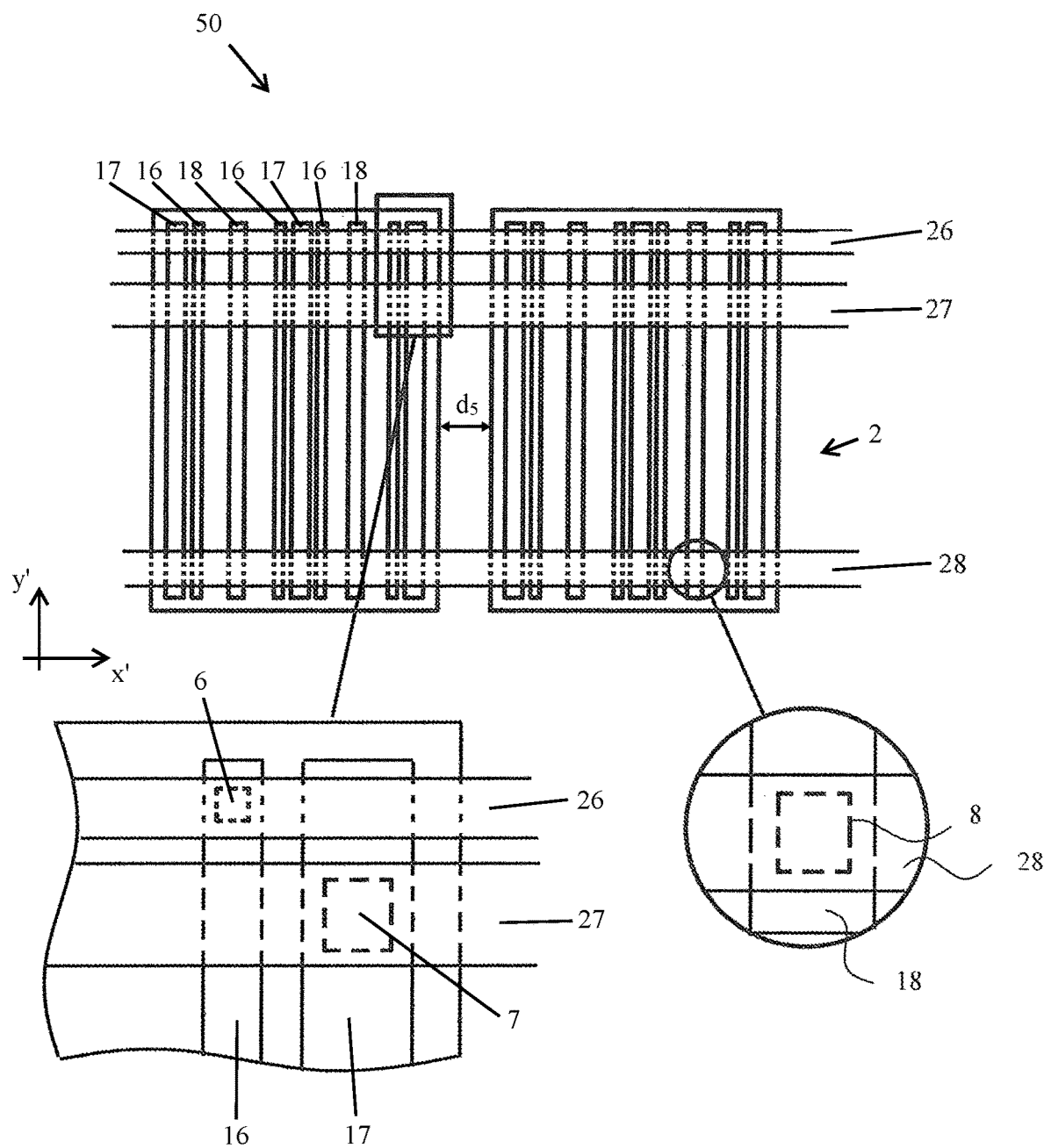
FIG. 4 shows printed functional units that are wired to each other on a second semiconductor wafer, as a semiconductor device 50.

FIG. 4 shows a semiconductor device 50 on a second semiconductor wafer. The semiconductor device comprises two functional units 2 wired to each other on the second semiconductor wafer.

The wiring comprises a plurality of conductor tracks: a gate conductor track 26, a source conductor track 27 and a drain conductor track 28. The conductor tracks 26, 27, 28 are rectilinear.

The gate conductor track 26 interconnects all gate contact areas 6, the source conductor track 27 interconnects all source contact areas 7 and the drain conductor track 28 interconnects all drain contact areas 8 (not shown).

This is illustrated in a first (on the left) and a second (on the right) detailed view of FIG. 4, in which each of the gate contact area 6, source contact area 7 and drain contact area 8 is shown overlapped by the gate conductor track 26, source conductor track 27 and drain conductor track 28.

The functional units 2 are arranged side by side in a row and spaced from each other.

The distance $d_5$ is the distance between the functional units.

The distance $d_5$ can correspond to the distance $d_3$ between the functional units 2 on the first semiconductor wafer.

More than two wired functional units 2 can also be arranged on the second semiconductor wafer, in particular, at least five functional units 2 can be arranged side by side and wired to each other.

Two rows of functional units 2 that are each arranged side by side and wired to each other can also be arranged on the second semiconductor wafer. In this case, the conductor tracks can also all be parallel to each other and interconnect only contacts of one terminal type in each case.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims. The reference numerals recited in the claims are not intended to be read as limiting any terms or the scope of the claims.

The invention claimed is:

1. A semiconductor device, comprising:
   at least two functional units that are identical to each other and wired to each other, wherein
   a wiring between the at least two functional units includes conductor tracks,
   each of the at least two functional units includes at least one gate finger, at least one source finger, and at least one drain finger, and
   a first one conductor track of the conductor tracks interconnects each of the at least one gate finger, a second conductor track of the conductor tracks interconnects each of the at least one source finger, and a third conductor track of the conductor tracks interconnects each of the at least one drain finger of the at least two functional units.

2. The semiconductor device according to claim 1, wherein each of the at least two functional units comprises at least two gate fingers, at least two source fingers and at least two drain fingers.

3. The semiconductor device according to claim 1, wherein each of the at least one gate finger includes a gate contact area, each of the at least one source finger includes a source contact area and each of the at least one drain finger includes a drain contact area.

4. The semiconductor device according to claim 3, wherein the first conductor track of the conductive tracks, the second conductor track of the conductive tracks, and the third conductor track of the conductive tracks interconnect the at least two functional units via the gate contact area, the source contact area, and the drain contact area, respectively.

5. The semiconductor device according to claim 4, wherein the first conductor track, the second conductor track, and the third conductor track of the conductor tracks interconnect the at least two functional units via the gate contact area, the source contact area, and the drain contact area in an electrically conductive manner.

6. The semiconductor device according to claim 3, wherein the gate contact area, the source contact area and the drain contact area of the two identical functional units are arranged such that an imaginary straight line drawn in one direction in each contact area, which imaginary straight line interconnects all contacts of a respective terminal type, without contacting any of another terminal type being intersected by the imaginary straight line.

7. The semiconductor device according to claim 1, wherein the first conductor track of the conductor tracks, the second conductor track of the conductor tracks, and the third conductor track of the conductor tracks are rectilinear.

8. The semiconductor device according to claim 1, comprising at least five functional units that are identical to each other.

9. The semiconductor device according to claim 1, wherein the at least two functional units are arranged in a grid directly adjacent to each other.

10. The semiconductor device according to claim 3, wherein the first conductor track of the conductor tracks interconnects the gate contact area of all of the at least one gate finger, the second conductor track of the conductor tracks interconnects the source contact area of all of the at least one source finger, and the third conductor track of the conductor tracks interconnects the drain contact area of all of the at least one drain finger of the at least two functional units.

11. The semiconductor device according to claim 3, wherein the first conductor track of the conductor tracks does not contact one gate contact area, the second conductor track of the conductor tracks does not contact one source contact area, and/or the third conductor track of the conductor tracks does not contact one drain contact area.

12. The semiconductor device according to claim 11, wherein the at least one gate finger is short-circuited to the at least one source finger of one of the at least two functional units.

13. The semiconductor device according claim 1, wherein the at least two functional units are transistors.

14. The semiconductor device according to claim 13, wherein the at least two functional units are GaN high electron mobility transistors (HEMT).

15. A transistor comprising the semiconductor device according to claim 1.

16. The transistor of claim 15, wherein the semiconductor device is a GaN HEMT.

17. The semiconductor device according to claim 1, wherein
   semiconductor dies on a carrier are physically separate from each other, and
   each of the semiconductor dies includes the at least one gate finger, the at least one source finger, and the at least one drain contact finger on an upper surface thereof.

18. A semiconductor device, comprising:
   a plurality of semiconductor dies on a carrier that are physically separate from each other and each includes two functional units that are identical to each other and wired to each other, wherein
   a wiring between the two functional units includes conductor tracks,
   each of the two functional units further includes a gate finger, a source finger, and a drain finger,
   a first conductor track of the conductor tracks interconnects the gate finger, a second conductor track of the conductor tracks interconnects the source finger, and a third conductor track of the conductor tracks interconnects the drain finger of the two functional units, and
   the plurality of semiconductor dies include gate, source, and drain contact fingers on an upper surface thereof.

19. The semiconductor device according to claim 18, wherein each of the two functional units includes two gate fingers, two source fingers, and two drain fingers.

20. The semiconductor device according to claim 18, wherein each of the gate finger includes a gate contact area, each of the source finger includes a source contact area, and each of the drain finger includes a drain contact area.

21. The semiconductor device according to claim 20, wherein the first conductor track of the conductive tracks, the second conductor track of the conductive tracks, and the third conductor track of the conductive tracks interconnect the at least two functional units via the gate contact area, the source contact area, and the drain contact area, respectively.

22. The semiconductor device according to claim 20, wherein the first conductor track, the second conductor track, and the third conductor track of the conductor tracks interconnect the two functional units via the gate contact area, the source contact area, and the drain contact area in an electrically conductive manner.

23. The semiconductor device according to claim 22, wherein the gate contact area, the source contact area and the drain contact area of the two identical functional units are arranged such that an imaginary straight line drawn in one direction in each of the gate contact area, the source contact area, and the drain contact area, wherein the imaginary straight line interconnects all contacts of a respective terminal type (gate, source, drain), without contacting any of another terminal type being intersected by the imaginary straight line.

24. The semiconductor device according to claim 18, wherein the first conductor track of the conductor tracks, the second conductor track of the conductor tracks, and the third conductor track of the conductor tracks are rectilinear.

25. The semiconductor device according to claim 18, comprising at least five functional units that are identical to each other.

26. The semiconductor device according to claim 18, wherein the two functional units are arranged in a grid directly adjacent to each other.

27. The semiconductor device according to claim 20, wherein the first conductor track of the conductor tracks interconnects the gate contact area of the gate finger, the second conductor track of the conductor tracks interconnects the source contact area of the source finger, and the third conductor track of the conductor tracks interconnects the drain contact area of the drain finger of both of the two functional units.

28. The semiconductor device according to claim 20, wherein the first conductor track of the conductor tracks does not contact one gate contact area, the second conductor track of the conductor tracks does not contact one source contact area, and/or the third conductor track of the conductor tracks does not contact one drain contact area of the two functional units.

29. The semiconductor device according to claim 28, wherein the gate finger is short-circuited to the source finger of one of the two functional units.

30. The semiconductor device according claim 18, wherein the two functional units are transistors.

31. The semiconductor device according to claim 30, wherein the two functional units are GaN high electron mobility transistors (HEMT).

32. A transistor comprising the semiconductor device according to claim 18.

33. The transistor of claim 32, wherein the semiconductor device is a GaN HEMT.

* * * * *